(12) United States Patent
Heydari et al.

(10) Patent No.: US 7,279,980 B2
(45) Date of Patent: Oct. 9, 2007

(54) NON-UNIFORM DISTRIBUTED MULTI-STAGE CIRCUITS

(75) Inventors: Payam Heydari, Irvine, CA (US); Ahmad Yazdi, Irvine, CA (US)

(73) Assignee: Regents of the University of California, Oakland, CA (US)

( * ) Notice: Subject to any disclaimer, the term of this patent is extended or adjusted under 35 U.S.C. 154(b) by 103 days.

(21) Appl. No.: 11/117,935

(22) Filed: Apr. 28, 2005

(65) Prior Publication Data

US 2006/0244536 A1 Nov. 2, 2006

(51) Int. Cl.
*H03F 3/60* (2006.01)
(52) U.S. Cl. ..................................... 330/286
(58) Field of Classification Search ................. 330/54, 330/286, 295
See application file for complete search history.

(56) References Cited

U.S. PATENT DOCUMENTS 6,597,243 B1 * 7/2003 Fratti ........................... 330/54
7,129,783 B2 * 10/2006 Young et al. ................ 330/286

OTHER PUBLICATIONS

Ahmad Yazdi et al., "A 1.8V Three-Stage 25 GHz 3dB-BW Differential Non-Uniform Downsized Distributed Amplifier", 2005 IEEE International Solid-State Circuits Conference, Session 8, pp. 10-12.

Ahmad Yazdi and Payam Heydari, "The Design and Analysis of Non-Uniform Down-Sized Differential Distributed Amplifiers", 2004 IEEE Symposium on Quality Electronic Design, pp. 528-533, Jun. 2004.

Ahmad Yazdi and Payam Heydari, "A Novel Non-Uniform Distributed Amplifier", IEEE International Symposium on Circuits and Systems, vol. 1, pp. 613-616, May 2004.

* cited by examiner

*Primary Examiner*—Robert Pascal
*Assistant Examiner*—Hieu Nguyen
(74) *Attorney, Agent, or Firm*—Orrick, Herrington & Sutcliffe LLP

(57) ABSTRACT

Provided herein is a non-uniform multi-stage distributed circuit capable of operation with an improved gain-bandwidth product. The circuit can include an input port, an output port and a transmission line coupled therebetween. Two or more amplifier stages can be coupled successively to the transmission line. Each amplifier stage can include a transistor having a transistor parameter, which can be scaled to be less than the transistor parameter of any preceding amplifier stage. The inductance of each portion of the transmission line between adjacent stages can also be scaled to be less than the inductance of the portion of the transmission line between any preceding amplifier stages. The inductance can be scaled in addition to or instead of the transistor parameter.

34 Claims, 3 Drawing Sheets

US 7,279,980 B2

NON-UNIFORM DISTRIBUTED MULTI-STAGE CIRCUITS

FIELD OF THE INVENTION

The present invention relates to distributed circuits and, more particularly, to distributed circuits having multiple non-uniform stages.

BACKGROUND INFORMATION

In accordance with the ever-increasing growth in wireless and wire-line communication markets, it is desirable that integrated circuits, such as analog and RF front-ends, operate with wider bandwidths in higher frequency ranges, such as the multi-Gigahertz range. One circuit architecture capable of performing at such a level is the distributed amplifier circuit architecture. A distributed amplifier typically trades delay with bandwidth in order to achieve a much higher bandwidth than a lumped architecture. There have been tremendous efforts to use and implement distributed architectures in various technologies within the communications and other markets.

Distributed amplifiers generally employ a topology in which inductors or transmission lines (T-lines) separate two or more uniform amplifier stages, yet the output currents from each individual stage can combine in an additive fashion. Viewed from another perspective, the parasitic capacitances of the various amplifier stages are absorbed into the actual (or artificial) transmission lines resulting in a higher bandwidth. However, despite the additive nature of the gain, the distributed architecture still produces a relatively low overall gain and gain-bandwidth product.

One of primary sources of performance degradation in distributed amplifiers is the non-zero inductive loss and non-zero output resistance of the amplifier stages, which can decrease both the overall gain and bandwidth. The inductive loss typically increases with frequency due to the skin effect phenomenon. As a consequence, the bandwidth of the distributed amplifiers is generally dependent on the amount of loss in the transmission lines.

Thus, improved systems and circuits are needed capable of operating in higher frequency ranges with improved gain-bandwidth products.

SUMMARY

Described below are exemplary embodiments of multi-stage circuits and systems having the same. These embodiments are examples only and are not intended to limit the invention. In one exemplary embodiment, a multi-stage distributed circuit is provided having a transmission line with an input node and an output node and a plurality of amplifier stages successively coupled with the transmission line between the input node and the output node. Each amplifier stage can include a transistor having a transistor parameter scaled to be less than the transistor parameter of any preceding stage.

In another exemplary embodiment, the multi-stage distributed circuit can include a transmission line having an input node and an output node and a plurality of amplifier stages successively coupled with the transmission line between the input node and the output node. The inductance of a portion of the transmission line located between adjacent amplifier stages can be scaled to be less than any preceding portion of the transmission line located between adjacent amplifier stages.

In another exemplary embodiment, an electronics system is provided having a multi-stage circuit including a transmission line having an input node and an output node and a plurality of amplifier stages successively coupled with the transmission line between the input node and the output node. Each amplifier stage can include a transistor having a transistor parameter scaled to be less than the corresponding transistor parameter of the transistor of any preceding amplifier stage. Also, a portion of the transmission line located between adjacent amplifier stages can have an inductance scaled to be less than the inductance of a portion of the transmission line located between any preceding amplifier stages.

In yet another exemplary embodiment, a multi-stage distributed circuit is provided including a transmission line having with an input node and an output node and a plurality of amplifier stages coupled with the transmission line, where each stage includes a transistor having a transconductance. In this embodiment, the transistor can be configured to amplify a signal transmitted on the transmission line from the input node to the output node and at least one amplifier stage can be scaled to have a transconductance that is relatively less than the transconductance of any preceding stage.

In still yet another exemplary embodiment, a method of processing a signal with a distributed circuit is provided. The method can include transmitting a signal from a first node of a transmission line to a second node of the transmission line and processing the signal with a plurality of stages coupled successively with the transmission line, wherein each stage comprises a transistor having a transistor parameter, the transistor parameter of at least one stage being scaled to be less than the transistor parameter of any preceding stage.

Other systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims. It is also intended that the invention is not limited to require the details of the example embodiments.

BRIEF DESCRIPTION OF THE FIGURES

The details of the invention, including fabrication, structure and operation, may be gleaned in part by study of the accompanying figures, in which like reference numerals refer to like segments.

DETAILED DESCRIPTION

Figure 1:
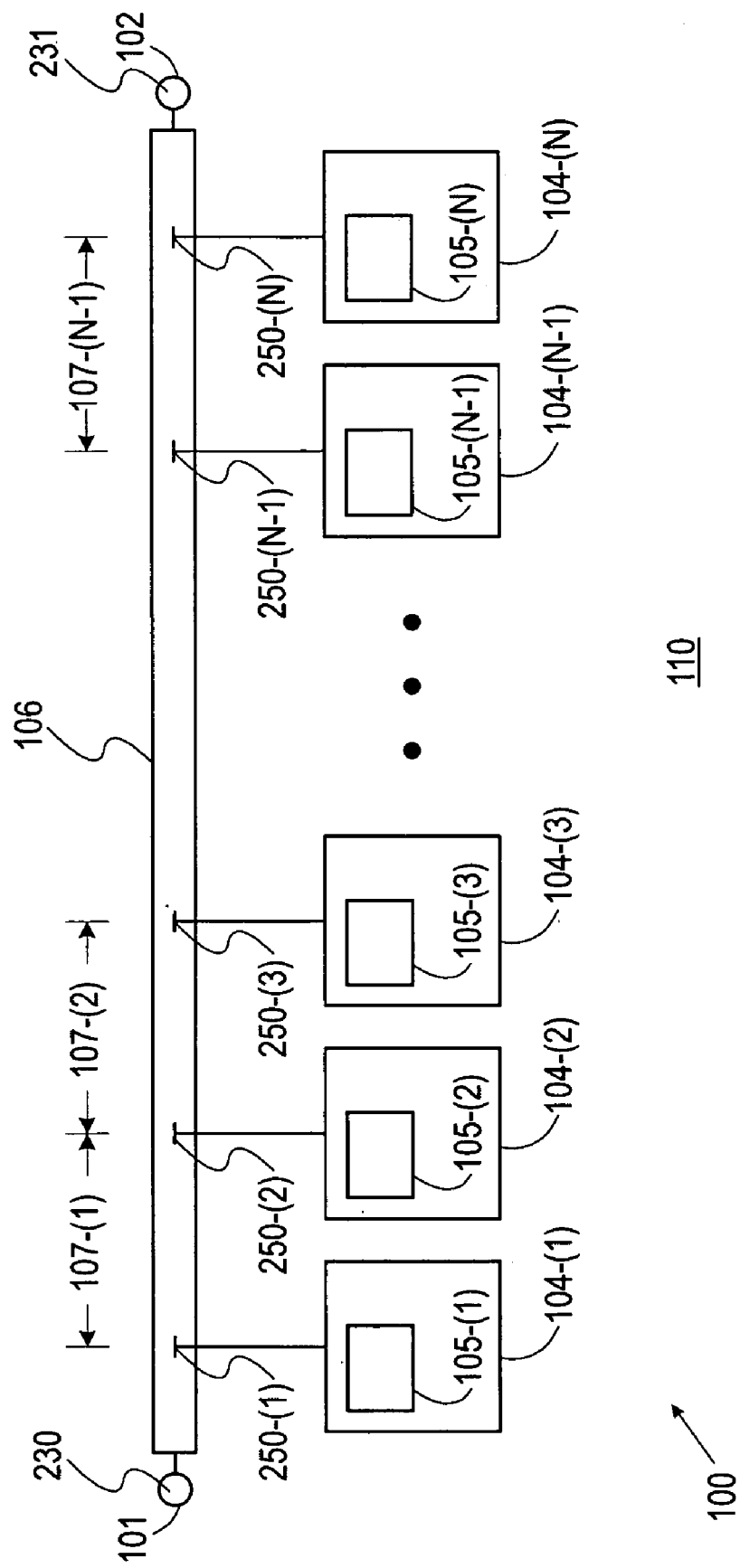
FIG. 1 is a block diagram depicting one exemplary embodiment of a multi-stage distributed circuit.

FIG. 1 depicts an exemplary embodiment of a non-uniform multiple stage distributed amplifier (DA) circuit 100 capable of operating in high frequency ranges with an improved gain-bandwidth product, while accounting for non-ideal losses of the circuit elements. Here, a DA circuit 100 includes an input port 101, an output port 102, multiple amplifier stages 104 and a transmission line 106 having an input node 230 and an output node 231. The amplifier stages 104 are successively coupled with the transmission line 106 at intervals from the input node 230 to the output node 231. Here, each amplifier stage 104 is coupled with the transmission line 106 at an interface point 250, such that a portion 107 of the transmission line 106 separates adjacent amplifier stages 104. Each amplifier stage 104 preferably includes at least one active device, such as transistor 105 having an associated transistor parameter.

There are N amplifier stages 104 shown here, each stage 104 being referenced in the format 104-(X), where X is the stage number and can be any number between 1 and N. Throughout this description the amplifier stages 104-(1) through 104-(N) will be referenced as "amplifier stages 104" and it should be noted that this reference can include any or all amplifier stages 104-(1) through 104-(N), unless otherwise noted. The transistors 105, the portions 107 of transmission line 106, the interface points 108 and any other component type of the circuit 100 having multiple instances are also referenced using this format. It should also be noted that the circuit 100 is not limited to a certain number of stages 104 and, in fact, any number of two or more stages 104 can be used in circuit 100 in accordance with the needs of the application.

As used herein, the term "preceding" is defined as being arranged at a closer position electrically in relation to any input node 230. For instance, the amplifier stage 104-(1) is a preceding stage to the amplifier stage 104-(2) because it is located adjacent to the input node 230 while the stage 104-(2) has the stage 104-(1) located between it and the input node 230. Because the amplifier stage 104-(1) is directly adjacent the input node 230, the stage 104-(1) has no preceding stage.

Conversely, the term "successive" is defined herein as being arranged at a farther position electrically in relation to an input node 230. For instance, the amplifier stage 104-(2) is successive to the amplifier stage 104-(1) because the stage 104-(2) is located farther from the input node 230 than the stage 104-(1). Because the amplifier stage 104-(N) is generally the farthest stage 104 from the input node 230, no stage 104 will generally be successive to the amplifier stage 104-(N). Furthermore, the definitions of preceding and successive should not be limited to physical positioning alone. For instance, when fabricated, due to variations in layout and routing, the circuit 100 may have an amplifier stage 104-(2) that is physically closer to the input node 230 than the stage 104-(1). However, in this instance the stage 104-(1) would still precede the stage 104-(2) and the stage 104-(2) would still be successive to the stage 104-(1) because the stage 104-(1) is electrically closer to the input node 230, e.g., a signal traveling from the input node 230 to the output node 231 would encounter the stage 104-(1) before the stage 104-(2).

The circuit 100 is preferably configured as a distributed circuit where the amplifier stages 104 and the transmission line 106 are integrated on a common semiconductor substrate 110. However, it should be noted that the circuit 100 can be fabricated on multiple substrates 110 or otherwise configured in a non-distributed manner.

The circuit 100 is also preferably non-uniform, i.e., one or more stages 104 and/or the portions 107 of the transmission line 106 can be different from the remaining stages 104 or portions 107. For instance, the transistor parameter of the transistor 105 in each successive amplifier stage 104 can be scaled to be less than the transistor parameter of a transistor 105 in any preceding amplifier stage 104. In one preferred embodiment, the transistor parameter of each successive stage 104 is scaled to have a value that is 1/K that of the immediately preceding stage, if any, where K is a scaling constant having any value greater than one. Because the amplifier stage 104-(1) does not have a preceding amplifier stage 104, the transistor parameter of stage 104-(1) is preferably not scaled. Table 1 shows exemplary values of the transistor parameter for an embodiment of circuit 100 having five amplifier stages 104-(1) through 104-(5). Here, the initial stage 104-(1) has a transistor parameter with a value Y.

TABLE 1

| Stage | Transistor Parameter Value |
| --- | --- |
| 104-(1) | Y |
| 104-(2) | Y/K |
| 104-(3) | $Y/K^2$ |
| 104-(4) | $Y/K^3$ |
| 105-(5) | $Y/K^4$ |

Likewise, the inductance of each successive portion 107 of the transmission line 106 can be scaled to be less than the inductance of any preceding portion 107 of the transmission line 106. In another preferred embodiment, the inductance of each portion 107 of the transmission line 106 is scaled to have a value that is 1/K that of the immediately preceding portion of the transmission line 106, if any. Because the portion 107-(1) does not have a preceding portion 107 between adjacent amplifier stages 104, the portion 107-(1) is preferably not scaled. Table 2 shows exemplary values of the transistor parameter for another embodiment of the circuit 100 having five amplifier stages 104-(1) through 104-(5). Here, the initial portion 107-(1) of transmission line 106 has an inductance Z.

TABLE 2

| Portion | Inductance Value |
| --- | --- |
| 107-(1) | Z |
| 107-(2) | Z/K |
| 107-(3) | $Z/K^2$ |
| 107-(4) | $Z/K^3$ |

As used herein, the term "scaling" is defined to include adjustment, variation or configuration at a different value. The term scaling is not limited to a constant variation between the objects being scaled.

It should be noted that one or more stages 104 can have similar or the same transistor parameters and that every stage 104 need not be scaled to a different parameter value. For instance, the transistor parameter corresponding to the stage 104-(2) can be scaled to be less than that of the stage 104-(1), but the transistor parameters of any additional stages successive to the stage 104-(2) need not be scaled to be less than that of the stage 104-(2). Likewise, one or more portions 107 of the transmission line 106 can have similar or the same inductance values and every portion 107 need not be scaled to a different value. Also, the transistor parameters of the stages 104 can be scaled without scaling portions 107 of the transmission line 106, if desired, and vice-versa.

The amplifier stages 104 can be configured in any manner desired. Some examples of the amplifier stages 104 include, but are not limited to, differential amplifiers, single-ended amplifiers, cascade or cascode amplifiers, amplifiers fabricated with field effect transistors (FETs) or with bipolar junction transistors (BJTs) or any combination thereof.

Other types of stages 104 that are configured to process a signal on the transmission line 106 without amplification can also be used.

The transmission line 106 can also be configured in any manner desired. For instance, the transmission line 106 can be an actual monolithic transmission line or an artificial transmission line configured with some of the properties of an actual transmission line, such as a series combination of inductors.

Figure 2:
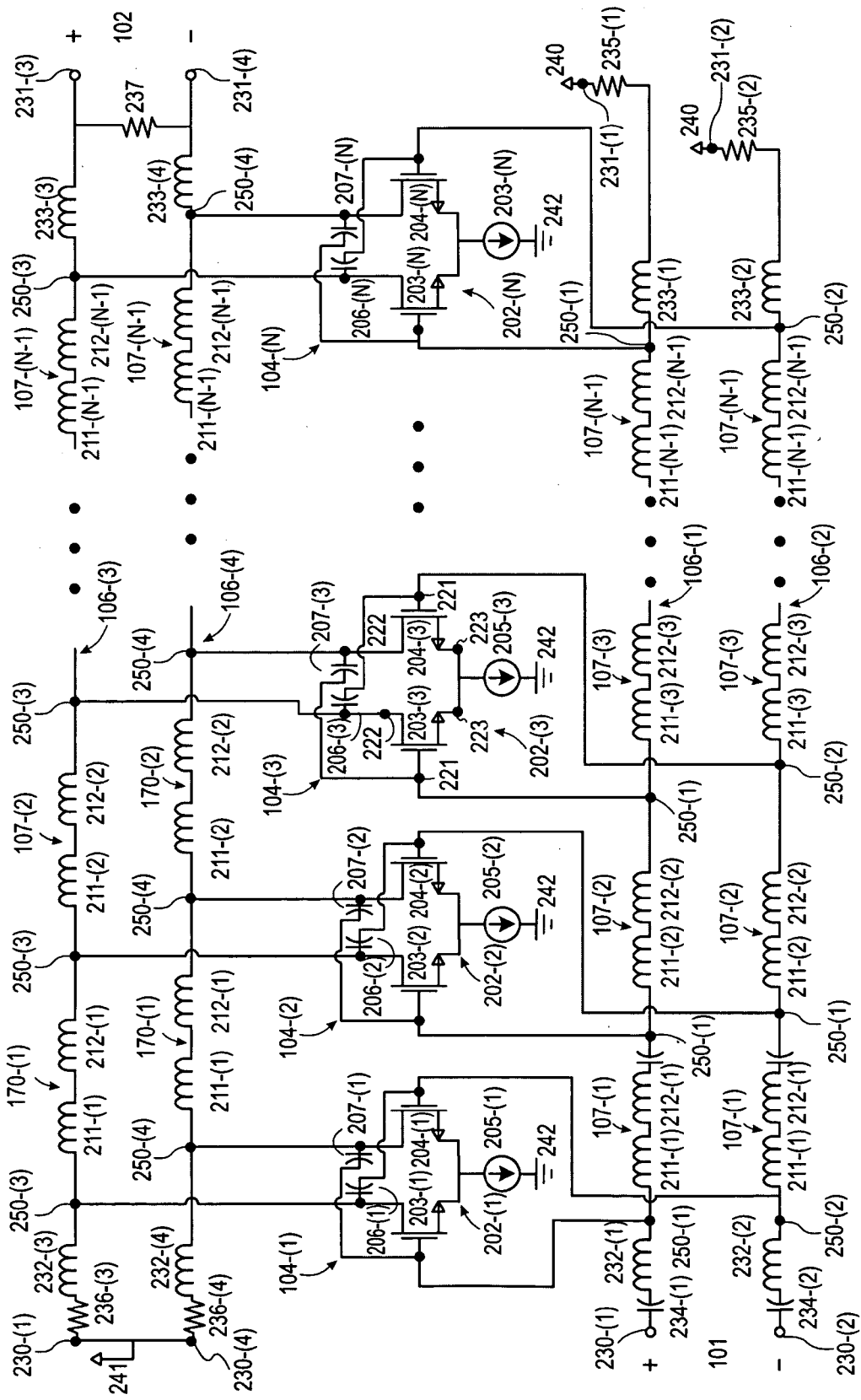
FIG. 2 is a schematic view depicting another exemplary embodiment of a differential multi-stage distributed circuit.

FIG. 2 depicts another exemplary embodiment of the DA circuit 100. In this embodiment, each amplifier stage 104 includes a differential amplifier 202 having a first transistor 203 and a second transistor 204, a current source 205 and a first capacitor 206 and a second capacitor 207. Also included are four transmission lines 106-(1) through 106-(4) configured as artificial transmission lines where each portion 107 located between adjacent stages 104 includes a first inductor 211 and a second inductor 212. Each transmission line 106 has an initial input node 230 and an output node 231. An initial inductor 232 is coupled between the input node 230 and the first portion 107-(1) for each transmission line 106 and a final inductor 233 is coupled between the output node 231 and the last portion 107-(N−1) for each transmission line 106.

In this embodiment, the input port 101 includes input nodes 230-(1) and 230-(2) and the output port 102 includes output nodes 231-(3) and 231-(4). The transmission lines 106-(1) and 106-(2) have bypass capacitors 234-(1) and 234-(2) coupled between the input nodes 230-(1) and 230-(2) and the initial inductors 232-(1) and 232-(2), respectively. The transmission lines 106-(1) and 106-(2) are terminated to resistors 235-(1) and 235-(2) coupled between the output nodes 231-(1) and 231-(2) and the final inductors 233-(1) and 233-(2), respectively. The resistors 235 with resistance values equal to the transmission lines' characteristic impedance provide the matched termination with zero reflection coefficient. The output nodes 231-(1) and 231-(2) can be coupled with a biasing power supply 240.

The transmission lines 106-(3) and 106-(4) are terminated to resistors 236-(3) and 236-(4) coupled between the input nodes 230-(3) and 230-(4) and the initial inductors 232-(3) and 232-(4), respectively. Similar to the resistors 235, the resistors 236 provide matched termination. The input nodes 230-(3) and 230-(4) can be coupled with a main power supply 241. The transmission lines 106-(3) and 106-(4) can also have an optional resistor 237 coupled between the output nodes 231-(3) and 231-(4) for load matching purposes.

Here, the transistors 203 and 204 can each correspond to transistor 105 described with respect to FIG. 1. Each transistor 203 and 204 is preferably configured as a FET having a gate node 221, a drain node 222 and a source node 223. Each FET 203 and 204 has a gate structure (not shown) that can have a polygonal cross-sectional area defined by a width (W) and a length (L) in contact with the underlying silicon. In this embodiment, the scaled transistor parameter for each amplifier stage 104 is the ratio of the width to length (W/L) for the gate structure. Scaling of the W/L ratio can also be referred to as scaling the size of the transistors 203 and 204, and causes the transconductance (gm) and various parasitic capacitances of the transistors 203 and 204 (e.g., the drain-bulk capacitance ($C_{db}$), the gate-source capacitance ($C_{gs}$), the drain-source output conductance ($G_{ds}$) etc.) to scale along with the W/L ratio.

The source node 223 of both the transistors 203 and 204 are coupled together with the current source 205, which is also coupled with a ground node 242. The level of current provided by the current source 205 and the capacitance of capacitors 206 and 207 can also be scaled with the transistor parameter W/L as desired. The capacitors 206 and 207 are preferably included to compensate for the gate-drain overlap capacitance within each transistor 203 and 204. Here, the capacitor 206 is coupled with the drain node 222 of the transistor 203 and the gate node 221 of the transistor 204 and the capacitor 207 is coupled with the drain node 222 of the transistor 204 and the gate node 221 of the transistor 203. In one exemplary embodiment, the capacitors 206 and 207 are formed from transistors with the drain and source shorted together.

The transmission lines 106-(1) and 106-(2) are preferably coupled with the gate nodes 221 of the transistors 203 and 204 in each stage 104 at the interface points 250-(1) and 250-(2), respectively. The transmission lines 106-(3) and 106-(4) are preferably coupled with the drain nodes 222 of the transistors 203 and 204 in each stage 104 at the interface nodes 250-(3) and 250-(4), respectively. To attain a substantially zero reflection from each interface node 250 and maximize power transfer to the output port 102, the characteristic impedances of each portion 107 is preferably substantially the same.

Table 3 shows exemplary values for the transistor parameter W/L for both transistors 203 and 204, the current level provided by current source 205 and the capacitances of the capacitors 206 and 207 for an embodiment of the circuit 100 having six stages 104, where the values are scaled to be 1/K that of the corresponding value in the immediately preceding stage 104.

TABLE 3

| Stage | W/L for each transistor 203 and 204 | Current level provided by current source 205 | Capacitance of capacitors 206 and 207 |
|---|---|---|---|
| 104-(1) | W/L | $I_{SS}$ | C |
| 104-(2) | (W/L)/K | $I_{SS}/K$ | C/K |
| 104-(3) | (W/L)/$K^2$ | $I_{SS}/K^2$ | C/$K^2$ |
| 104-(4) | (W/L)/$K^3$ | $I_{SS}/K^3$ | C/$K^3$ |
| 104-(5) | (W/L)/$K^4$ | $I_{SS}/K^4$ | C/$K^4$ |
| 104-(6) | (W/L)/$K^5$ | $I_{SS}/K^5$ | C/$K^5$ |

Table 4 shows exemplary values for the inductance of the inductors 211 and 212 in each portion 107 of the transmission line 106 in an embodiment of the circuit 100 having six stages 104, where the inductance values are scaled to be 1/K that of the corresponding value in the immediately preceding portion 107. In this embodiment, the inductance values of the initial inductor 232 in the transmission lines 106-(1) and 106-(2) is $L_d/2$, and the inductance values of the initial inductor 232 in the transmission lines 106-(3) and 106-(4) is $L_g/2$.

TABLE 4

| Portion | Inductor | Inductance Value for Transmission Lines 106-(1) and 106-(2) | Inductance Value for Transmission Lines 106-(3) and 106-(4) |
|---|---|---|---|
| 107-(1) | 211 | $L_d/2$ | $L_g/2$ |
|  | 212 | $L_d/2K$ | $L_g/2K$ |
| 107-(2) | 211 | $L_d/2K$ | $L_g/2K$ |
|  | 212 | $L_d/2K^2$ | $L_g/2K^2$ |
| 107-(3) | 211 | $L_d/2K^2$ | $L_g/2K^2$ |
|  | 212 | $L_d/2K^3$ | $L_g/2K^3$ |
| 107-(4) | 211 | $L_d/2K^3$ | $L_g/2K^3$ |
|  | 212 | $L_d/2K^4$ | $L_g/2K^4$ |

TABLE 4-continued

| Portion | Inductor | Inductance Value for Transmission Lines 106-(1) and 106-(2) | Inductance Value for Transmission Lines 106-(3) and 106-(4) |
|---|---|---|---|
| 107-(5) | 211 | $L_d/2K^4$ | $L_g/2K^4$ |
|  | 212 | $L_d/2K^5$ | $L_d/2K^5$ |

As can be seen from Table 4, the inductance values of each inductor 211 and 212 in each successive portion 107 of the transmission lines 106 is 1/K that of the corresponding inductor in the immediately preceding portion. Conventional uniform multi-stage distributed circuits use a constant inductive value for each portion of the transmission line between adjacent stages. For instance, a conventional circuit might be configured such that each portion of the transmission lines located between adjacent amplifier stages has an inductive value twice that of the initial portion of the transmission line located between an input port and the first stage, which in this case would be $L_d$ for transmission lines connected to any drain node and $L_g$ for transmission lines connected to any gate node.

For instance, eq. (1) shows the DC gain equation for an N-stage conventional uniform distributed circuit where each amplifier stage is substantially the same and each portion of the transmission line separating adjacent amplifier stages has substantially the same inductance.

$$|A_v| = \frac{g_m(R_{0d}R_{0g})^{\frac{1}{2}}\sinh[0.5N(A_d - A_g)]e^{-N(A_d+A_g)/2}}{2\left[1 - \left(\frac{\omega}{\omega_c}\right)\right]^{1/2}\sinh[0.5(A_d - A_g)]}. \quad (1)$$

where, $g_m$ is the transconductance of the amplifying transistors;

N is the number of amplifier stages;

$R_{0g}$ and $R_{0d}$ are the series loss of an inductor used as the portion of the transmission line located between the adjacent amplifier stages for the gate-connected transmission line and a drain-connected transmission line, respectively;

$A_g$ and $A_d$ are the line attenuations for the gate-connected transmission line and the drain-connected transmission line, respectively; and $\omega_c$ is the cutoff frequency for each transmission line ($\omega_{cg}=\omega_{cd}$) and equals $$\frac{2}{\sqrt{L_dC_d}} = \frac{2}{\sqrt{L_gC_g}}.$$

Eq. (1) shows that the voltage transfer function of any conventional DA decreases exponentially with the attenuation of gate/drain transmission lines. The line attenuations, $A_d$ and $A_g$ ($A_d$=Re{$\sqrt{(j\omega L_d+R_{0d})(G_{ds}+jC_d\omega)}$} and $A_g$=Re{$\sqrt{(j\omega L_g+R_{0g})jC_g\omega)}$}; where $C_g$ is the gate capacitance seen looking at the input of each MOS device, $C_d$ is the drain capacitance, and $G_{ds}$ is the drain-source output conductance) are the only frequency-dependent parameters in the voltage transfer function of eq. (1).

In circuit 100, the stages 104 are downscaled to be relatively less than any preceding stage 104 and the inductance of the transmission line portions 107 are scaled to be relatively less than the inductance of any preceding transmission line portion 107 located between adjacent amplifier stages 104. This down-scaling increases the cutoff frequency of each transmission line 106, which decreases the frequency dependence of the line attenuations $A_d$ and $A_g$. Because the bandwidth is limited by the frequency dependence of the line attenuations $A_d$ and $A_g$, this downscaling increases the bandwidth of the circuit 100.

For uniform distributed amplifiers in which all gain stages are identical, the contribution of each gain stage to the overall output gain is the same. More precisely, the voltage waveform at the load termination is the superposition of the voltage waveforms propagating through different stages. This implies that for the case of identical gate and drain lines, the voltage gain associated with each signal path, including gain stage, from the input to the output port of the amplifier is the same. On the other hand, the gain of each stage is linearly proportional to the transconductance of each stage. For a fixed biasing point, the transconductance of each stage is linearly proportional to the sizing of the transistors of that stage. Consequently, for fixed bias points, sizing of the transistors linearly affects the overall gain.

Thus, downscaling each stage 104 in the circuit 100 can also decrease the overall gain of the circuit 100, but this decrease is minimal when compared to the increase in bandwidth. The decrease in gain is minimal mainly because the overall gain is more dependent on the initial stages 104 than the later, successive stages 104. The signals entering the initial stages 104 typically have higher amplitude and average signal power than the signals traveling down to the successive stages 104. As a result, the gain drop-off is not severe and the circuit 100 is capable of performing with an improved gain-bandwidth product in addition to other performance advantages, such as a lower noise factor and accountance for non-ideal circuit elements.

It should be noted that the values of transistor parameters of the transistors 203 and/or 204, the current level provided by the current source 205, the capacitance of the capacitors 206 and/or 207 and the inductance of the portions 107 of the transmission line 106 can each, alone or in combination, be scaled in any manner desired including, but not limited to scaling each by the same constant factor, K, scaling each by a different or variable factor, not scaling certain values at all or any combination thereof in accordance with the needs of the application. Furthermore, the actual transistor parameter that is scaled, or reduced between stages can be any transistor parameter that will effect the gain-bandwidth product. For instance, other transistor parameters include, but are not limited to, the transconductance and one or more parasitic capacitances.

An embodiment of the circuit 100 similar to that described with respect to FIG. 2 was fabricated and tested and shown to operate with an improved performance over conventional distributed multi-stage circuits. In particular, the embodiment showed an improved gain-bandwidth product, $S_{21}$ parameter and noise factor with relatively less power dissipation than conventional circuits. The embodiment was fabricated in a Silicon-Germanium process (SiGe) with a 1.8V power supply 241, three stages 104, Ld and Lg values of 363 picoHenries (pH), a K factor of 1.5, a W/L ratio of 180 microns/0.2 microns, resistance values for resistors 235 and 236 of 50 ohms and a resistance value for resistor 237 of 100 ohms. As one of skill in the art will readily recognize, these values are example values only and can be varied as desired. These values are not intended, nor should they be used, to limit the invention to only these or similar values. Furthermore, the circuit 100 is fully scalable across numerous process technologies of which SiGe is only one and the circuit 100 is likewise not limited to fabrication only in SiGe processes. Finally, one of skill in the art will readily recognize that the performance results of the circuit 100 can vary as the fabrication of the circuit 100 and the configuration and implementation of the various components of the circuit 100 are varied.

A fully differential architecture, such as that depicted in FIG. 2, significantly reduces the circuit 100's sensitivity to substrate and power/ground noise appearing as common-mode fluctuations. In addition, the progressive downsizing of circuit 100 minimizes the input referred noise, and hence the circuit's overall noise factor (NF), because it broadens the gain-bandwidth product. A circuit similar to the embodiment of circuit 100 depicted in FIG. 2, is described in further detail in "A 1.8V Three-Stage 25 GHz 3 dB-BW Differential Non-Uniform Downsized Distributed Amplifier" published and presented in the IEEE International Solid-State Circuits Conference (ISSCC), February 2005.

Figure 3:
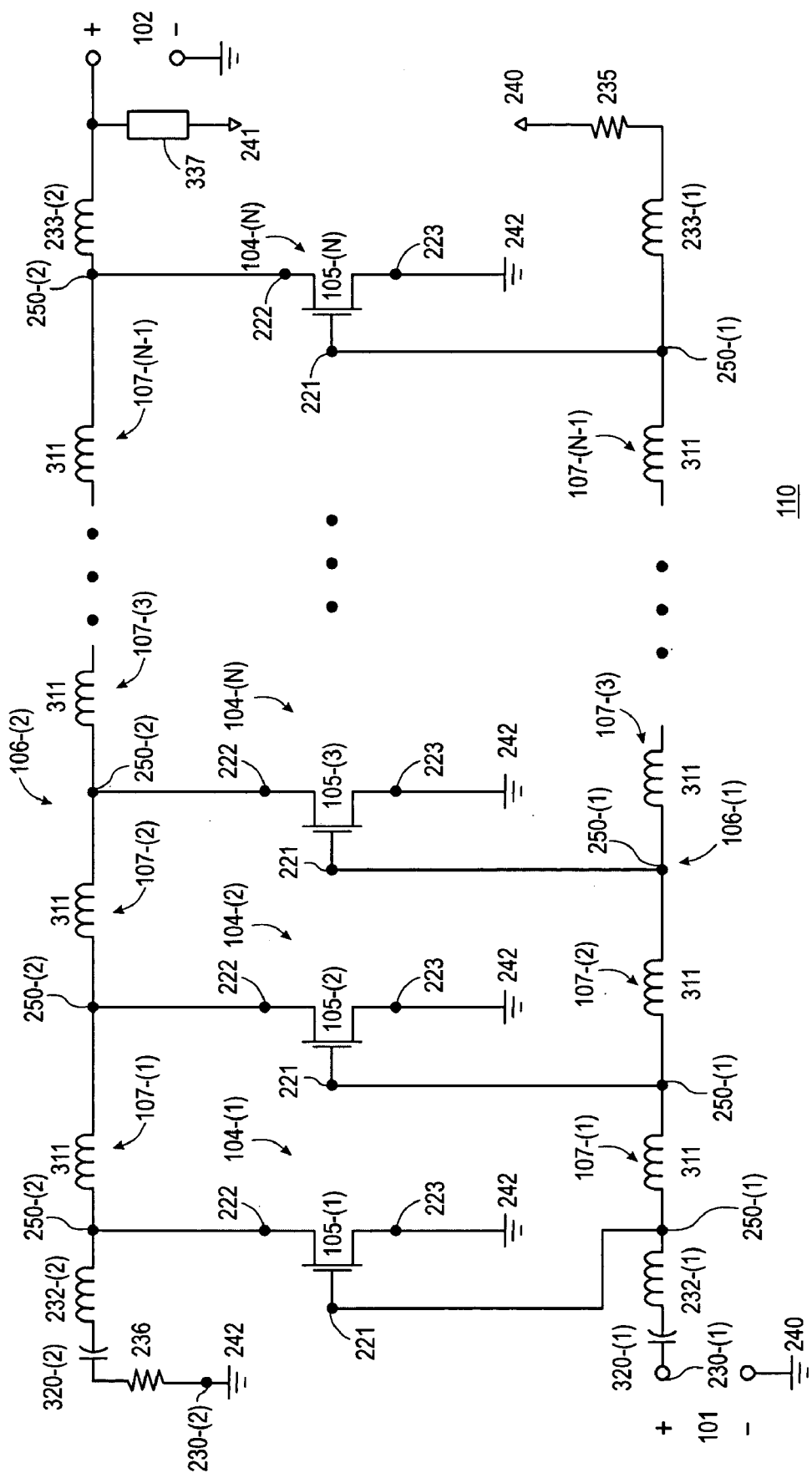
FIG. 3 is a schematic view depicting another exemplary embodiment of a single-ended multi-stage distributed circuit.

As mentioned above, however, the circuit 100 is not limited to any one amplifier architecture. For instance, another embodiment of the circuit 100 is depicted in FIG. 3 where each amplifier stage 104 is configured as a single-ended amplifier having one transistor 105. Because a single-ended configuration is used, only two transmission lines 106-(1) and 106-(2) are needed, one each for the gate and drain connections to the transistor 105, respectively. Again, a transistor parameter for the transistor 105 is preferably scaled to be less than a transistor parameter for a transistor 105 in any preceding stage 104. Also, the inductance for a portion 107 of each transmission line 106 can be scaled to be less than the inductance for any other portion 107 of the same transmission line 106 located between preceding adjacent amplifier stages 104.

In this embodiment, each portion 107 of the transmission lines 106-(1) and 106-(2) includes a single inductor 311. Both transmission lines 106 include a capacitor 320 near the input node 230. The transmission line 106-(2) includes a termination load 337 coupled with supply 241 for matching purposes. A circuit similar to the embodiment of circuit 100 depicted in FIG. 3, where each successive amplifier stage 104 and portion 107 is scaled by 1/K, is described in further detail in "A Novel Non-Uniform Distributed Amplifier" published in IEEE International Symposium on Circuits and Systems (ISCAS), March 2004, which is fully incorporated by reference herein.

Also provided herein are methods for using circuit 100 in a desired application. For instance, in one exemplary method, a signal is transmitted from a first node 230 of a transmission line 106 to a second node 231 of the transmission line 106. Then, the signal is processed with a plurality of stages 104 coupled successively with the transmission line 106. Preferably, each stage 104 comprises a transistor 105 having a transistor parameter. The transistor parameter of at least one stage 104 is preferably scaled to be less than the transistor parameter of any preceding stage 104. Similar to embodiments described above, the transistor parameter of each stage 104 can be scaled to be 1/K that of the transistor parameter of the immediately preceding stage 104, if any, where K is any number greater than one.

In another exemplary method, a signal is again transmitted from a first node 230 of a transmission line 106 to a second node 231 of the transmission line 106 and then processed with a plurality of stages 104 coupled successively with the transmission line 106. Preferably, at least one portion 107 of the transmission line 106 has an inductance scaled to be less than the inductance of any preceding portion 107 of the transmission line 106 between preceding adjacent stages 104. Similar to embodiments described above, the inductance of each portion 107 can be scaled to be 1/K that of the inductance of the immediately preceding portion 107 of the transmission line 106 located between adjacent preceding stages 104, if any, where K is any number greater than one.

The embodiments of the circuit 100 described herein can be used in any desired application, either as a stand-alone or as part of an electronics system. Some exemplary applications include, but are not limited to, mixers, multiplexers, broadband amplifiers, output drivers for high-speed broadband systems and wideband radio frequency (RF) front-ends for wideband radios and the like.

In the foregoing specification, the invention has been described with reference to specific embodiments thereof. It will, however, be evident that various modifications and changes may be made thereto without departing from the broader spirit and scope of the invention. For example, each feature of one embodiment can be mixed and matched with other features shown in other embodiments. Features and processes known to those of ordinary skill may similarly be incorporated as desired. Additionally and obviously, features may be added or subtracted as desired. Accordingly, the invention is not to be restricted except in light of the attached claims and their equivalents.

What is claimed is:

1. A multi-stage distributed circuit, comprising:
    a transmission line having an input node and an output node; and
    a plurality of amplifier stages successively coupled with the transmission line between the input node and the output node, each amplifier stage comprising a transistor having a transistor parameter, wherein the transistor parameter of each stage is scaled to be less than the transistor parameter of any preceding stage,
    wherein the inductance of a portion of the transmission line located between adjacent amplifier stages is scaled to be less than the inductance of any preceding portion of the transmission line located between adjacent amplifier stages.

2. The circuit of claim 1, wherein the plurality of amplifier stages comprises:
    an initial stage coupled with the transmission line adjacent to the input node; and
    one or more successive stages coupled successively with the transmission line between the initial stage and the output node, wherein the transistor parameter of each of the one or more successive stages is scaled to be less than the transistor parameter of the immediately preceding stage.

3. The circuit of claim 1, wherein the transmission line and the plurality of amplifier stages are integrated on a common semiconductor substrate.

4. The circuit of claim 1, wherein the inductance of each successive portion of the transmission line located between adjacent amplifier stages is scaled to be less than the immediately preceding portion of the transmission line located between adjacent amplifier stages.

5. The circuit of claim 4, wherein each portion of the transmission line located between adjacent amplifier stages comprises a first inductor and a second inductor, the first inductor being coupled with a first stage and the second inductor, and the second inductor being coupled with the first inductor and a second stage, and further wherein the second stage is successive to the first stage, the first inductor has a first inductance and the second inductor has a second inductance, the second inductance being scaled to be relatively less than the first inductance.

6. The circuit of claim 4, wherein the transmission line is a monolithic transmission line.

7. The circuit of claim 4, wherein each portion of the transmission line located between adjacent amplifier stages has substantially the same characteristic impedance.

8. The circuit of claim 1, wherein the transistor has a gate structure defined by a width (W) and a length (L) and wherein the transistor parameter is the ratio of the width to the length (W/L).

9. The circuit of claim 1, wherein the transistor parameter is a transconductance of the transistor.

10. The circuit of claim 1, wherein the transistor is a first transistor and the transistor parameter is a first transistor parameter, each amplifier stage is configured as a differential amplifier stage comprising the first transistor and a second transistor having a second transistor parameter, and the second transistor parameter is scaled to be less than the second transistor parameter of any preceding stage.

11. The circuit of claim 1, wherein the transistor parameter is a parasitic capacitance of the transistor.

12. A multi-stage distributed circuit, comprising:
a transmission line having an input node and an output node; and
a plurality of amplifier stages successively coupled with the transmission line between the input node and the output node, each amplifier stage comprising a transistor having a transistor parameter, wherein the transistor parameter of each stage is scaled to be less than the transistor parameter of any preceding stage,
wherein the transistor is a first transistor and the transistor parameter is a first transistor parameter, each amplifier stage is configured as a differential amplifier stage comprising the first transistor and a second transistor having a second transistor parameter, and the second transistor parameter is scaled to be less than the second transistor parameter of any preceding stage,
wherein the first transistor comprises a first gate node, a first drain node and a first source node and the second transistor comprises a second gate node, a second drain node and a second source node and wherein the transmission line is a first transmission line coupled with the first drain node of each amplifier stage, wherein the circuit further comprises:
a second transmission line;
a third transmission line; and
a fourth transmission line, wherein the second third and fourth transmission lines each have an input node and an output node, the second transmission line is coupled with the second drain node of each amplifier stage, the third transmission line is coupled with the first gate node of each amplifier stage, and the fourth transmission line is coupled with the second gate node of each amplifier stage.

13. The circuit of claim 12, wherein the first, second, third and fourth transmission lines comprise a first, a second, a third and a fourth plurality of transmission line portions, respectively, each portion being located between adjacent amplifier stages and having an inductance scaled to be less than any preceding portion of the same transmission line.

14. The circuit of claim 13, wherein the first transistor has a first gate structure defined by a first width and a first length, the first transistor parameter being the ratio of the first width to the first length, and the second transistor has a second gate structure defined by a second width and a second length, the second transistor parameter being the ratio of the second width to the second length.

15. The circuit of claim 13, wherein the first transistor has a first transconductance and the second transistor has a second transconductance, the first and second transistor parameters being the first and second transconductances, respectively.

16. The circuit of claim 13, wherein each stage further comprises a current source configured to source a current, the current source being coupled with the first and second source nodes and being scaled such that the current is less than the current of the current source in any preceding stage.

17. The circuit of claim 13, further comprising:
a first capacitor coupled between the first drain node and the second gate node; and
a second capacitor coupled between the first gate node and the second drain node.

18. A multi-stage distributed circuit, comprising:
a transmission line having an input node and an output node;
a plurality of amplifier stages successively coupled with the transmission line between the input node and the output node, wherein the inductance of a portion of the transmission line located between adjacent amplifier stages is scaled to be less than any preceding portion of the transmission line located between adjacent amplifier stages.

19. The circuit of claim 18, wherein the transmission line and the plurality of amplifier stages are integrated on a common semiconductor substrate.

20. The circuit of claim 18, wherein each portion of the transmission line located between adjacent amplifier stages comprises a first inductor and a second inductor, the first inductor being coupled with a first stage and the second inductor, and the second inductor being coupled with the first inductor and a second stage.

21. The circuit of claim 20, wherein the second stage is successive to the first stage, the first inductor has a first inductance and the second inductor has a second inductance, the second inductance being scaled to be relatively less than the first inductance.

22. The circuit of claim 18, wherein each portion of the transmission line located between adjacent amplifier stages has substantially the same characteristic impedance.

23. The circuit of claim 18, wherein each amplifier stage comprises an active device having a transistor parameter, wherein the transistor parameter of each stage is scaled to be less than the transistor parameter of a preceding stage.

24. The circuit of claim 23, wherein the active device is a transistor having a gate structure defined by a width (W) and a length (L) and wherein the transistor parameter is the ratio of the width to the length (W/L).

25. The circuit of claim 18, wherein the plurality of amplifier stages comprises a first amplifier stage, a second amplifier stage, and a third amplifier stage, the first amplifier stage being located adjacent to the input node, the second amplifier stage being located between the first amplifier stage and the third amplifier stage and the third amplifier stage being located between the second amplifier stage and the output node, and further wherein the transmission line comprises a first portion located between the first and second amplifier stages and a second portion located between the second and third amplifier stages, the inductance of the second portion being 1/K that of the first portion, where K is any number greater than one.

26. The circuit of claim 18, wherein each stage comprises a transistor having a transconductance, the transistor being configured to amplify a signal transmitted on the transmission line from the input node to the output node, wherein the transconductance of at least one amplifier stage is scaled to be relatively less than the transconductance of any preceding stage.

27. The circuit of claim 26, wherein the plurality of amplifier stages comprises a first stage located adjacent the input node and a second stage located between the initial stage and the output node, the transconductance of the successive amplifier stage being scaled to be 1/K that of the transconductance of the initial stage, where K is any number greater than one.

28. An electronics system, comprising:
 a multi-stage distributed circuit comprising:
  a transmission line having an input node and an output node; and
  a plurality of amplifier stages successively coupled with the transmission line between the input node and the output node, each amplifier stage comprising a transistor having a transistor parameter scaled to be less than the corresponding transistor parameter of the transistor of any preceding amplifier stage, wherein a portion of the transmission line located between adjacent amplifier stages has an inductance scaled to be less than the inductance of a portion of the transmission line located between any preceding amplifier stages.

29. The system of claim 28, wherein the transmission line and the plurality of amplifier stages are integrated on one common semiconductor substrate.

30. The system of claim 28, wherein the multi-stage circuit is a multiplexer.

31. The system of claim 28, wherein the multi-stage circuit is a mixer.

32. The system of claim 28, wherein the multi-stage circuit is an amplifier.

33. The system of claim 28, wherein the transistor parameter of at least one stage is scaled to have a value 1/K that of the transistor parameter of the immediately preceding stage, where K is any number greater than one.

34. A method of processing a signal with a distributed circuit, comprising:
 transmitting a signal from a first node of a transmission line to a second node of the transmission line;
 processing the signal with a plurality of stages coupled successively with the transmission line, wherein each stage comprises a transistor having a transistor parameter, the transistor parameter of at least one stage being scaled to be less than the transistor parameter of any preceding stage,
 wherein a first portion of the transmission line located between a first pair of adjacent stages has an inductance scaled to be relatively greater than the inductance of a second portion of the transmission line located between a second pair of adjacent stages successive to the first pair.

* * * * *